(12) United States Patent
Wu

(10) Patent No.: US 10,991,780 B2
(45) Date of Patent: Apr. 27, 2021

(54) ARRAY SUBSTRATE AND DISPLAY DEVICE

(71) Applicant: XIAMEN TIANMA MICRO-ELECTRONICS CO., LTD., Xiamen (CN)

(72) Inventor: Hao Wu, Xiamen (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 9 days.

(21) Appl. No.: 16/667,926

(22) Filed: Oct. 30, 2019

(65) Prior Publication Data

US 2020/0066806 A1   Feb. 27, 2020

(30) Foreign Application Priority Data

Mar. 20, 2019   (CN) .......................... 201910212095.6

(51) Int. Cl.
| | |
|---|---|
| *H01L 27/32* | (2006.01) |
| *G09G 3/3275* | (2016.01) |
| *G09G 3/3266* | (2016.01) |
| *G06F 1/16* | (2006.01) |

(52) U.S. Cl.
CPC .......... *H01L 27/326* (2013.01); *G06F 1/1626* (2013.01); *G06F 1/1637* (2013.01); *G09G 3/3266* (2013.01); *G09G 3/3275* (2013.01)

(58) Field of Classification Search
CPC ......... G09G 2300/0408; G09G 3/3275; G09G 3/3266; H01L 27/326; G06G 1/1626
See application file for complete search history.

(56) References Cited

U.S. PATENT DOCUMENTS 10,312,309 B2 *   6/2019   Lin ...................... G09G 3/3233
2019/0347989 A1 *  11/2019   Lee ..................... H01L 27/3258

FOREIGN PATENT DOCUMENTS

| CN | 108292488 A | 7/2018 |
|---|---|---|
| CN | 108711370 A | 10/2018 |

* cited by examiner

*Primary Examiner* — Joseph C. Nicely
(74) *Attorney, Agent, or Firm* — Kilpatrick Townsend & Stockton, LLP

(57) ABSTRACT

Disclosed are an array substrate and a display device. In some embodiments of the disclosure, at least one multi-access selector arranged proximate to a first non-right-angled edge is segmented into a plurality of sub-units, and the sub-units are arranged in an extension direction of the first non-right-angled edge.

14 Claims, 11 Drawing Sheets

ARRAY SUBSTRATE AND DISPLAY DEVICE

CROSS-REFERENCE TO RELATED APPLICATION

This application claims priority of Chinese Patent Application No. 201910212095.6, filed on Mar. 20, 2019, which is hereby incorporated by reference in its entirety.

FIELD

The present disclosure relates to the field of display technologies, and particularly to an array substrate and a display device.

BACKGROUND

The existing displays are categorized into a Liquid Crystal Display (LCD) and an Organic Light—Emitting Diode (OLED) display, where the LCD is a display which does not emit light by itself, and includes a backlight module providing a backlight source for the display to perform a display function, so the LCD may be discouraged to some extent from being made ultra—thin and ultra—lightweight; and the OLED display is a display which emits light by itself, and not necessarily arranged with a backlight module, so the OLED display to be made ultra—thin and ultra—lightweight is very promising.

SUMMARY

Some embodiments of the disclosure provide an array substrate including a display area, and a non-display area surrounding the display area, and the display area includes at least one first non-right-angled edge; and a plurality of multi-access selectors are arranged in the non-display area proximate to the first non-right-angled edge, and at least one of the multi-access selectors is segmented into a plurality of electrically connected sub-units, and the sub-units are arranged in an extension direction of the first non-right-angled edge.

Some embodiments of the disclosure provide a display device including the display panel above according to the embodiment of the disclosure.

DETAILED DESCRIPTION OF THE EMBODIMENTS

Particular implementations of an array substrate and a display device according to the embodiments of the disclosure will be described below in details with reference to the drawings.

Figure 1:
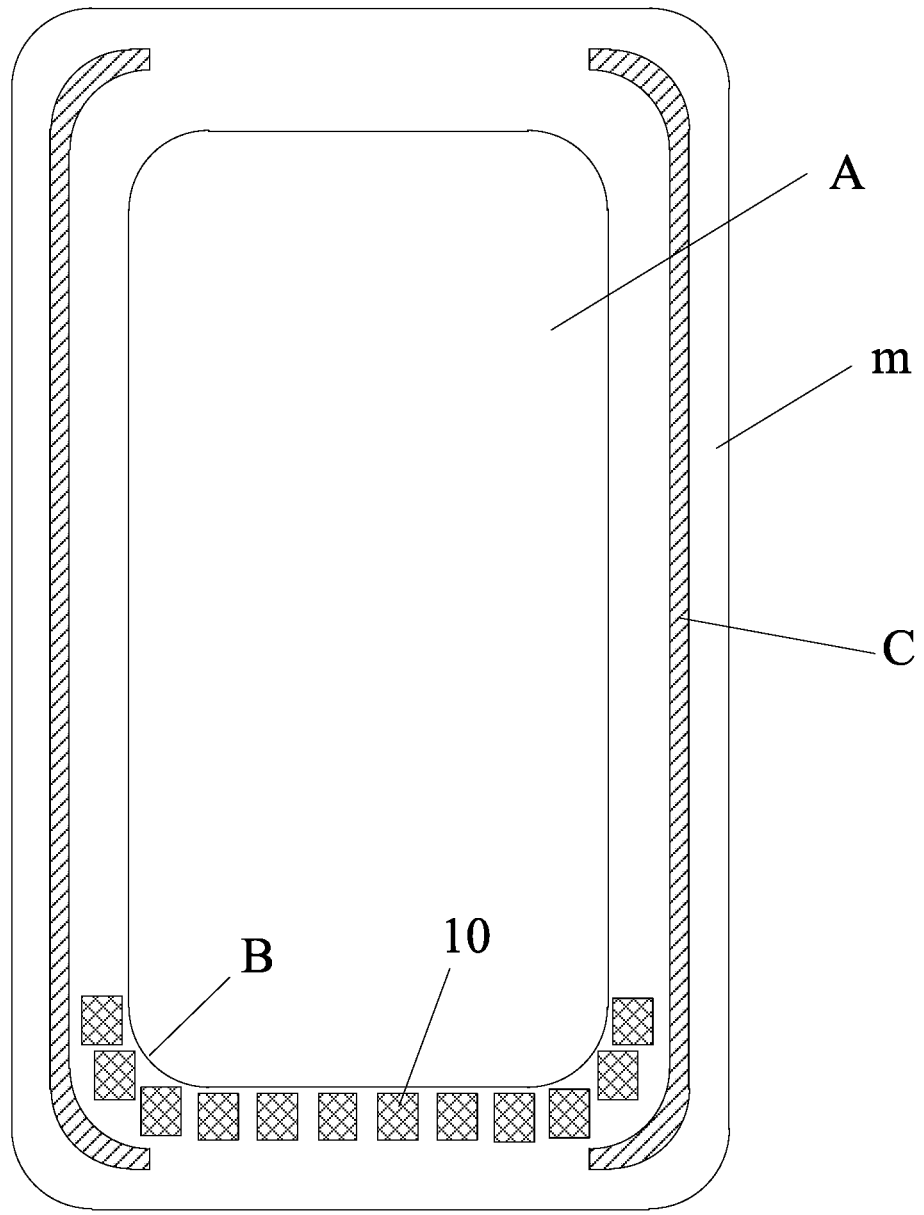
FIG. 1 is a schematic structural diagram of an array substrate in the related art.

In one embodiment, as illustrated in FIG. 1, a display panel in a display with non-right-angled corners includes a display area A, and a non-display area m surrounding the display area A, where a circuit area C surrounding a part of the display area A is arranged in the non-display area m, a plurality of concatenated shift registers (not illustrated) are arranged in the circuit area C, and each shift can be electrically connected with corresponding one of gate lines (not illustrated), configured to input a scan signal to the corresponding gate lines electrically connected therewith to thereby perform a display function. As illustrated in FIG. 1 again, the display area A includes a first non-right-angled edge B at which a plurality of multi-access selectors 10 are arranged between the circuit area C and the display area A, where the multi-access selectors 10 are arranged in the extension direction of the first non-right-angled edge B of the display area A.

In order to improve a screen to panel ratio, the area of the non-display area m occupied by the multi-access selectors 10 can be narrowed, that is, the sizes of the multi-access selectors 10 can be shrunk. However the sizes of the multi-access selectors 10 may not be shrunk indefinitely due to a limited size of a transistor, so a design of the display with a narrow bezel and a high screen to panel ratio may be discouraged to some extent.

In view of this, some embodiments of the disclosure provides an array substrate so as to improve the screen to panel ratio of a display, and to design the display with a narrow bezel.

Figure 2:
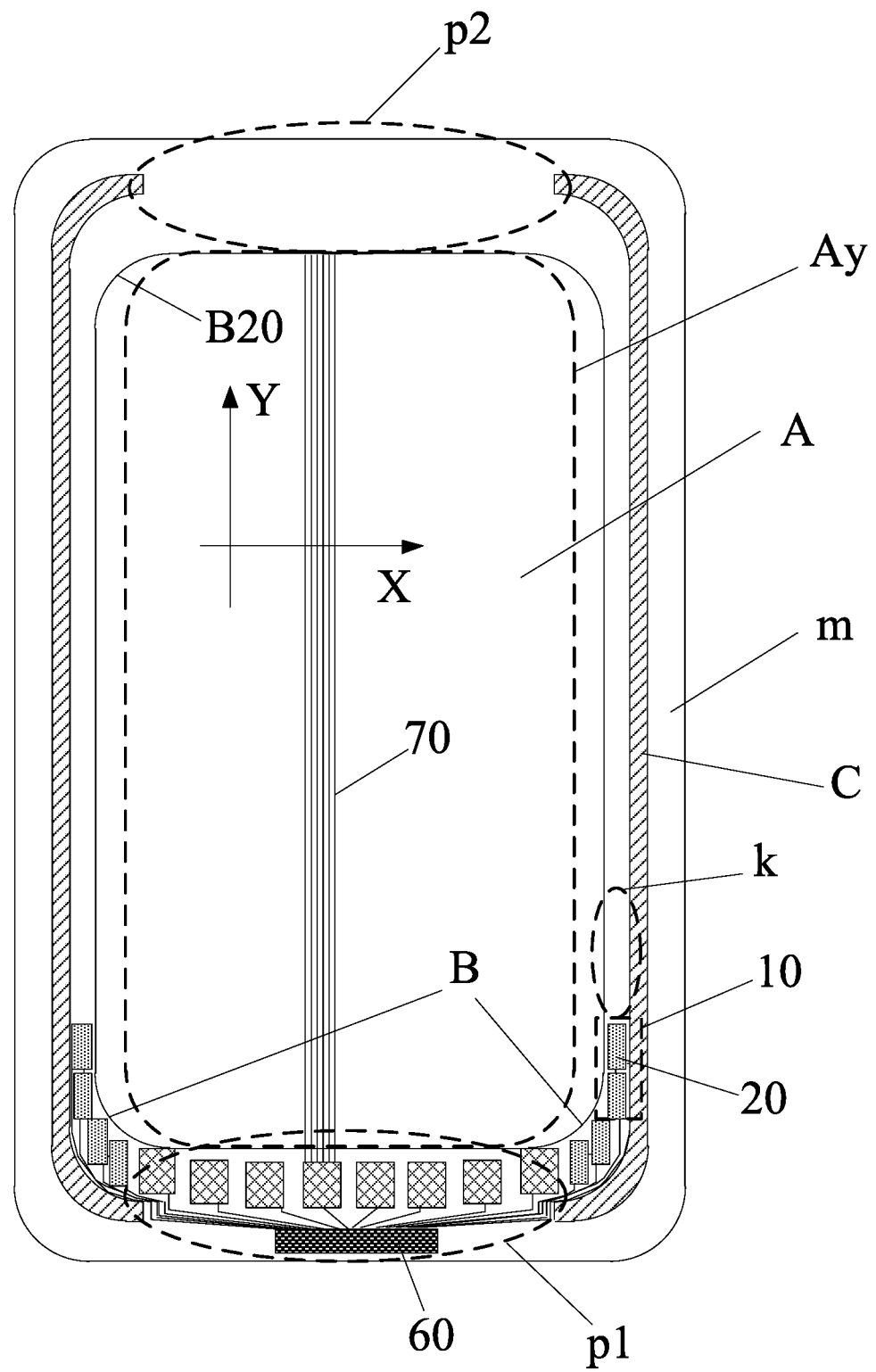
FIG. 2 is a schematic structural diagram of an array substrate according to some embodiments of the disclosure.

As illustrated in FIG. 2, the array substrate according to the embodiment of the disclosure can include: a display area A, and a non-display area m surrounding the display area A, where:

the display area A includes at least one first non-right-angled edge B; and a plurality of multi-access selectors 10 are arranged in the non-display area m proximate to the first non-right-angled edge B, where at least one of the multi-access selectors 10 is segmented into a plurality of electrically connected sub-units 20, and the respective sub-units 20 are arranged in the extension direction of the first non-right-angled edge B.

In the embodiment of the disclosure, the respective sub-units 20 are arranged in the extension direction of the first non-right-angled edge B, and as can be appreciated, the respective sub-units 20 are arranged from the left to the right at an interval from the top to the bottom or arranged vertically in the extension direction of the first non-right-angled edge B instead of being arranged in the X direction as illustrated in FIG. 2, so that the area of the non-display area m occupied by the multi-access selector 10 in the X direction can be narrowed, where the dotted line Ay in FIG. 2 represents the display area before the multi-access selector 10 is segmented, and apparently the multi-access selector 10 is segmented and the respective sub-units 2 are arranged to thereby extend the length of the display area A in the X direction so as to improve a screen to panel ratio, and to facilitate a design of the display with a narrow bezel.

Moreover when the respective sub-units 20 are arranged in the extension direction of the first non-right-angled edge B, the respective sub-units 20 can be arranged according to the shape of the first non-right-angled edge B to thereby greatly improve the flexibility of arranging the multi-access selector 10 so as to be adapted to displays in various shapes.

In a particular implementation, in the embodiment of the disclosure, the first non-right-angled edge B can be divided into at least two sub-edges, and the non-display area m can include sub-areas corresponding to the respective sub-edges. Furthermore multi-access selectors 10 are arranged in the sub-areas, and when the first non-right-angled edge B includes a first endpoint D1 and a second endpoint D2, at least one of the multi-access selectors 10 in the sub-area corresponding to the sub-edge including the first endpoint D1 is segmented into a plurality of sub-units 20 as illustrated in FIG. 3 to FIG. 7.

Figure 3:
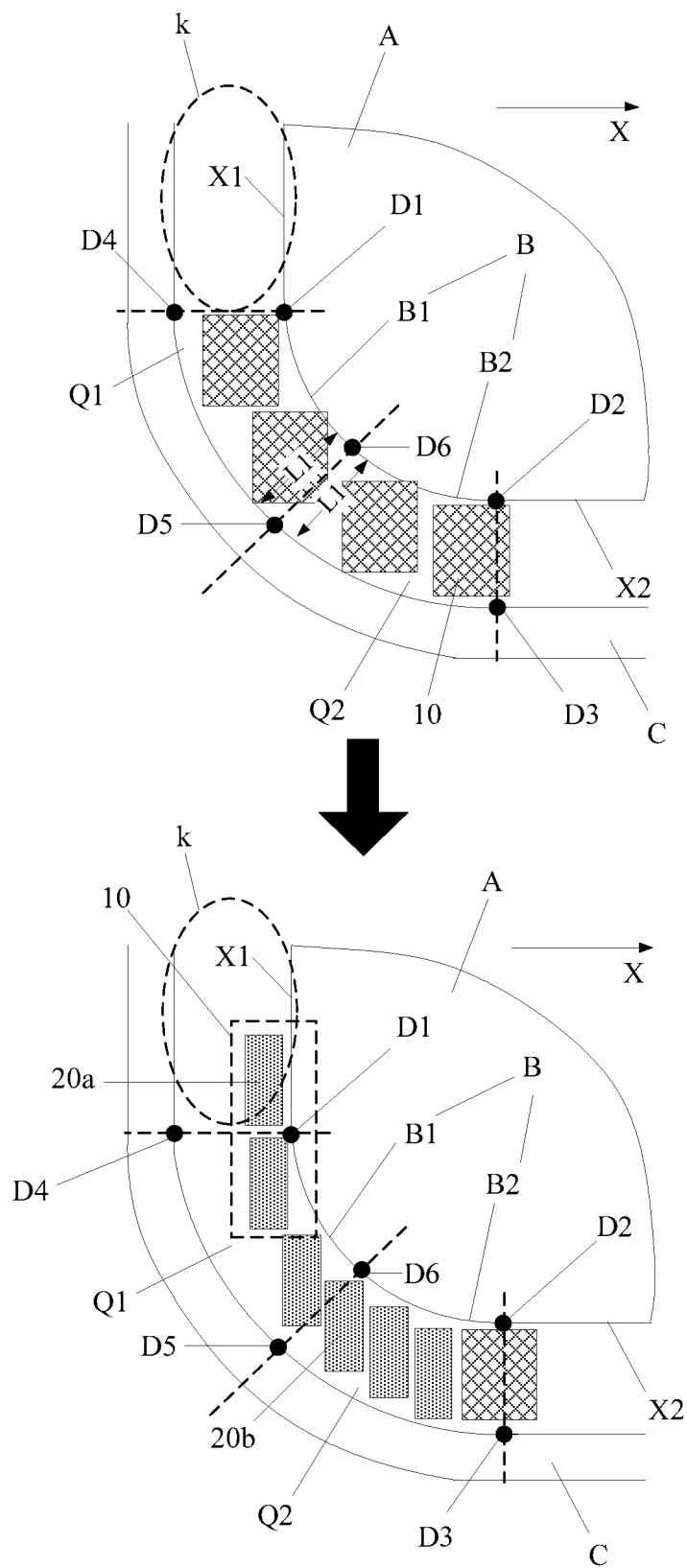
FIG. 3 is a first schematic comparison diagram of multi-access selectors according to some embodiments of the disclosure before and after they are segmented.

In one embodiment, FIG. 3 illustrates a schematic comparison diagram of the multi-access selectors 10 before and after they are segmented, where the upper sub-diagram illustrates the multi-access selectors before they are segmented, and the lower sub-diagram illustrates the multi-access selectors after they are segmented. The first non-right-angled edge B is divided into two sub-edges denoted respectively as B1 and B2, and correspondingly the non-display area m includes two sub-areas, denoted respectively as Q1 and Q2, corresponding to the two sub-edges, where the first endpoint of the first non-right-angled edge B is denoted as D1, and the second endpoint thereof is denoted as D2; and B1 includes D1, and B2 includes D2. Accordingly in order to determine which one or more of the multi-access selectors 10 is or are to be segmented, B1 includes D1, and B1 corresponds to the sub-area Q1, so at least one of the multi-access selectors 10 in only Q1 can be segmented into a plurality of sub-units 20 (not illustrated), or at least one of the multi-access selectors 10 in Q1 can be segmented into a plurality of sub-units 20, and at least one of the multi-access selectors 10 in Q2 can be segmented into a plurality of sub-units 20, that is, at least one of the multi-access selectors 10 in each sub-area can be segmented. As illustrated in FIG. 3, both of the multi-access selectors 10 in Q1 are segmented, and two multi-access selectors 10 are arranged in Q2, where one of the multi-access selectors 10 is segmented, and the other multi-access selector 10 is not segmented.

Figure 4:
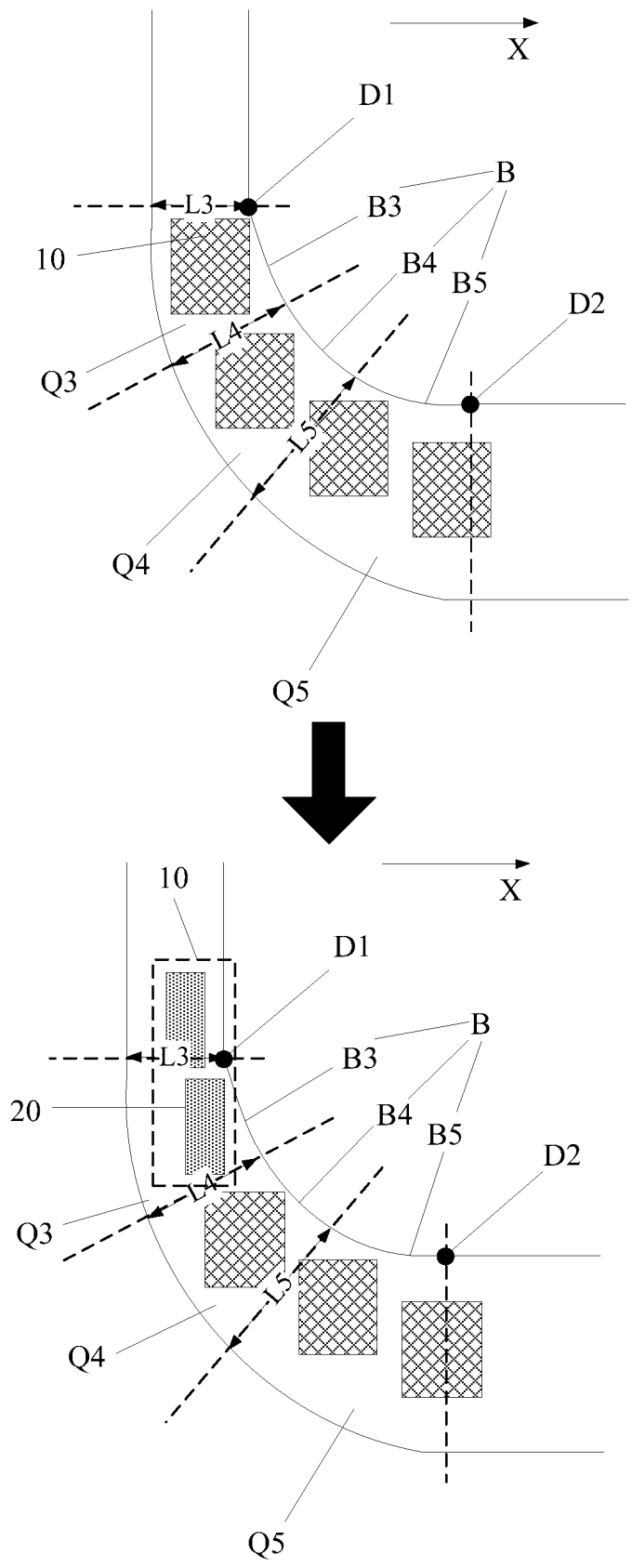
FIG. 4 is a second schematic comparison diagram of multi-access selector according to some embodiments of the disclosure before and after they are segmented.
Figure 5:
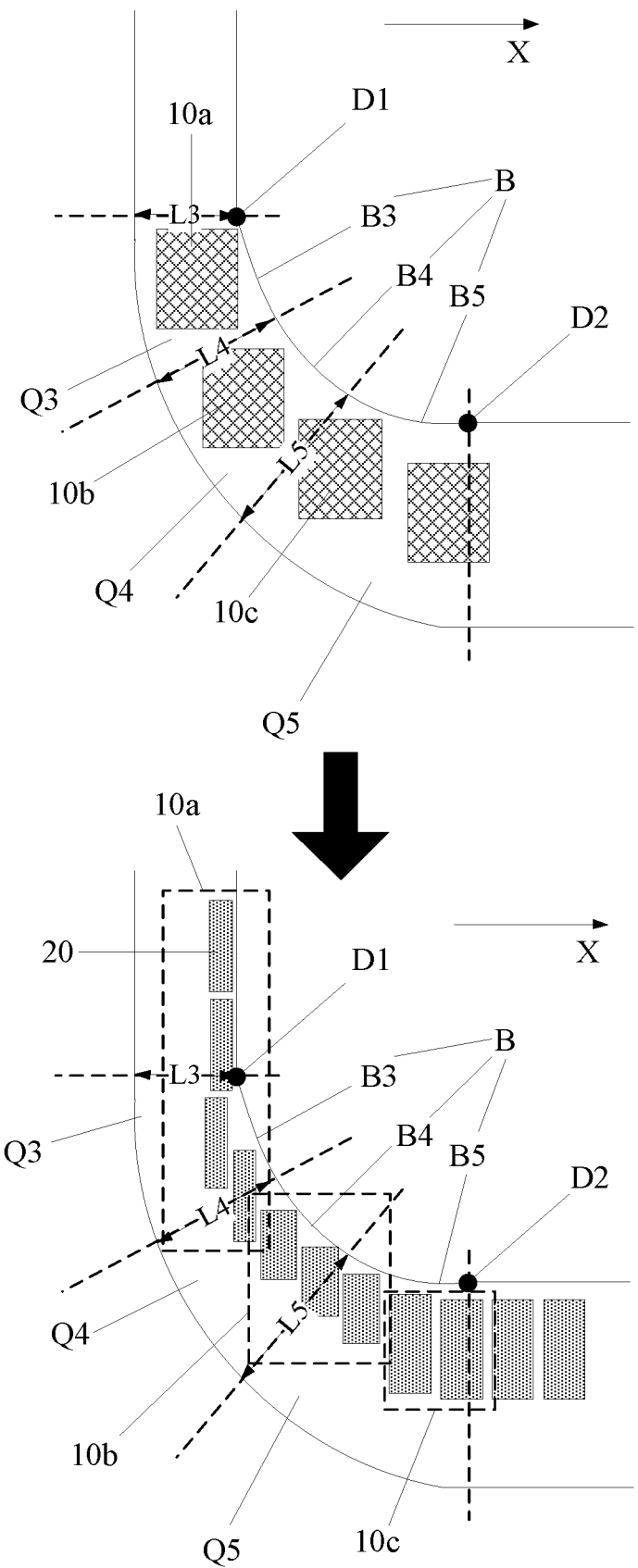
FIG. 5 is a third schematic comparison diagram of multi-access selectors according to some embodiments of the disclosure before and after they are segmented.

In another example, FIG. 4 and FIG. 5 illustrate schematic comparison diagrams of the multi-access selectors 10 before and after they are segmented, where each upper sub-diagram illustrates the multi-access selectors before they are segmented, and each lower sub-diagram illustrates the multi-access selectors after they are segmented. The first non-right-angled edge B is divided into three sub-edges denoted respectively as B3, B4, and B5; and correspondingly the non-display area m includes three sub-areas, denoted respectively as Q3, Q4, and Q5, corresponding to the three sub-edges, where the first endpoint of the first non-right-angled edge B is denoted as D1, and the second endpoint thereof is denoted as D2; and B3 includes D1, and B5 includes D2. Accordingly in order to determine which one or more of the multi-access selectors 10 is or are to be segmented, B3 includes D1, and B3 corresponds to the sub-area Q3, so at least one of the multi-access selectors 10 in only Q3 can be segmented into a plurality of sub-units 20, and since only one multi-access selector 10 is arranged in Q3 as illustrated in FIG. 4, the multi-access selector 10 is segmented; or at least one of the multi-access selectors 10 in Q3 can be segmented into a plurality of sub-units 20, and at least one of the multi-access selectors 10 in Q4 can be segmented into a plurality of sub-units 20 (not illustrated), that is, the multi-access selectors 10 in two of the sub-areas can be segmented; or at least one of the multi-access selectors 10 in Q3 can be segmented into a plurality of sub-units 20, and at least one of the multi-access selectors 10 in Q5 can be segmented into a plurality of sub-units 20 (not illustrated), that is, the multi-access selectors 10 in two of the sub-areas can be segmented; or at least one of the multi-access selectors 10 in Q3 can be segmented into a plurality of sub-units 20, at least one of the multi-access selectors 10 in Q4 can be segmented into a plurality of sub-units 20, and at least one of the multi-access selectors 10 in Q5 can be segmented into a plurality of sub-units 20, that is, at least one of the multi-access selectors 10 in each sub-area can be segmented. As illustrated in FIG. 5, only one multi-access selector 10 is arranged in each of Q3 and Q4, and two multi-access selectors 10 are arranged in A5, so the multi-access selector 10 in each of Q3 and Q4 is segmented, one of the multi-access selectors 10 in Q5 is segmented, and the other multi-access selector 10 in Q5 is not segmented.

It shall be noted that when one or more of the multi-access selectors 10 in a sub-area is or are segmented, all of the multi-access selectors 10 in the sub-area can be segmented (e.g., Q1 in FIG. 3, Q3 in FIG. 4, Q3 to Q5 in FIG. 5, Q6 in FIG. 6, and Q9 in FIG. 7), or a part of the multi-access selectors 10 can be segmented (e.g., Q2 in FIG. 3, and Q10 in FIG. 7), particularly dependent upon the shape of the first non-right-angled edge B, the size of a space in the first non-right-angled edge B, a fabrication difficulty, etc., as long as the area of the non-display area m occupied by the multi-access selector or selectors 10 in the X direction can be narrowed to thereby improve a screen to panel ratio, although the embodiment of the disclosure will not be limited thereto.

In this way, the first non-right-angled edge B can be divided, and the non-display area m corresponding to the first non-right-angled edge B can be divided, to thereby determine which one or more of the multi-access selectors 10 is or are to be segmented, so as to improve a screen to panel ratio, and to facilitate a design of the display with a narrow bezel, while simplifying the structure of the array substrate. Furthermore specific one of the sub-areas one or more of the multi-access selectors 10 is or are to be segmented can be selected flexibly according to the shape of the first non-right-angled edge B, a segmentation demand, etc., to thereby cater to various displays.

In one embodiment, in some embodiments of the disclosure, the first non-right-angled edge B can be divided in the following implementations, for example.

In a first implementation, if the first non-right-angled edge B is shape like an arc, then the first non-right-angled edge B will have a curvature, and at this time, the first non-right-angled edge B can be divided into respective sub-edges according to the curvature thereof, where the respective sub-edges have related curvatures.

In one embodiment, if the curvature of the first non-right-angled edge B is uniform, then the first non-right-angled edge B may be divided equally as illustrated in FIG. 3 to thereby lower the complexity of dividing the first non-right-angled edge B, and the difficulty and the cost of fabricating the array substrate.

In another example, if the curvature of the first non-right-angled edge B is not uniform, then the first non-right-angled edge B may also be divided equally as illustrated in FIG. 4 and FIG. 5 to thereby lower the complexity of dividing the first non-right-angled edge B.

In still another example, if the curvature of the first non-right-angled edge B is not uniform, then a plurality of critical values may be further determined according to the respective curvatures, and then the edge corresponding to the curvature between every two of the critical values may be determined as a sub-edge, so that the first non-right-angled edge B can be divided into a plurality of sub-edges (not illustrated).

Of course, the first non-right-angled edge B can In one embodiment, be divided according to the curvatures thereof in such a way that the curvatures are grouped into a group of small curvatures, and a group of large curvatures, where a critical point between the group of small curvatures, and the group of large curvatures can be determined as needed in reality, and then the group of small curvatures is divided equally, and the edge corresponding to the group of large curvatures is determined as a sub-edge, or the group of large curvatures can also be divided equally as long as the number of sub-edges into which the edge is divided according to the group of small curvatures is larger than the number of sub-edges into which the edge is divided according to the group of large curvatures.

In generally, the first non-right-angled edge B can In one embodiment, be divided otherwise according to the curvatures in other ways than the several examples above, and for example, it can be divided according to the shape of the display panel, the extension length of the first non-right-angled edge B, the respective curvatures of the first non-right-angled edge B, etc., although the embodiment of the disclosure will not be limited thereto. In this way, the flexibility of dividing the first non-right-angled edge B can be improved.

Figure 6:
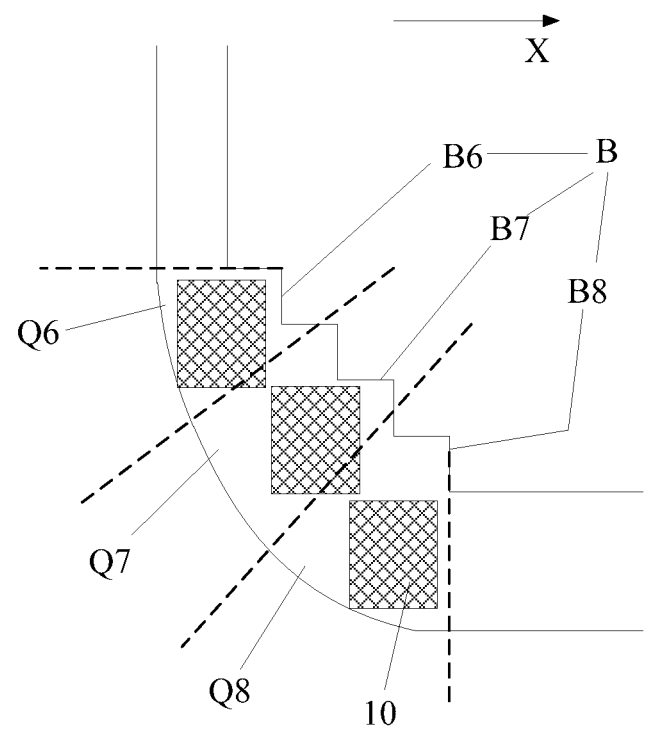
FIG. 6 is a fourth schematic comparison diagram of multi-access selectors according to some embodiments of the disclosure before and after it is segmented.
Figure 6:
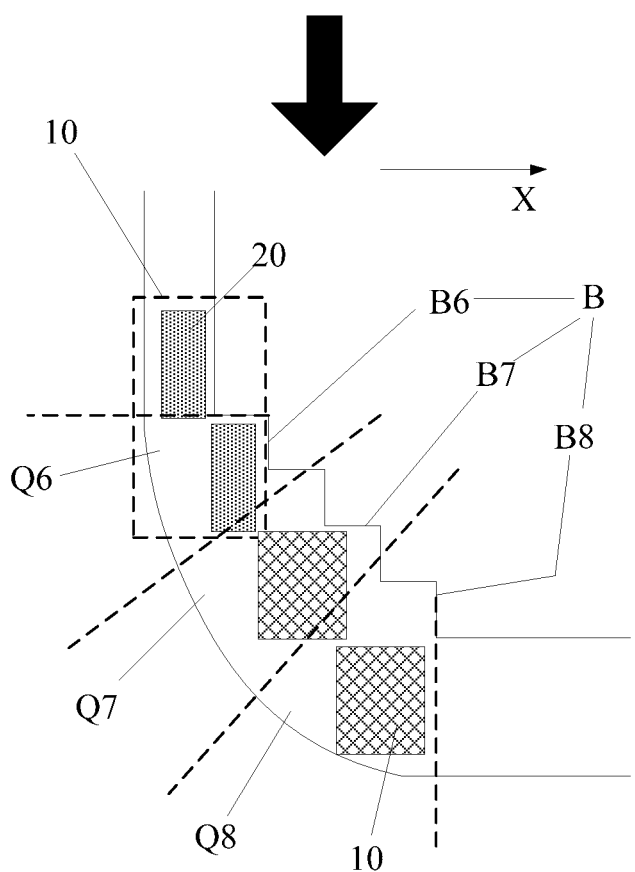

In a second implementation, if the first non-right-angled edge B is shaped like a step, then the first non-right-angled edge B may be divided equally into respective sub-edges; and as illustrated in FIG. 6, the first non-right-angled edge B is shaped like a step, and the first non-right-angled edge B is divided equally into three sub-edges denoted respectively as B6, B7, and B8, and at this time, the sub-edge corresponding to B6 is denoted as Q6, the sub-edge corresponding to B7 is denoted as Q7, and the sub-edge corresponding to B8 is denoted as Q8. In this way, the complexity of dividing the first non-right-angled edge B, and the difficulty and the cost of fabricating the array substrate can be lowered.

Figure 7:
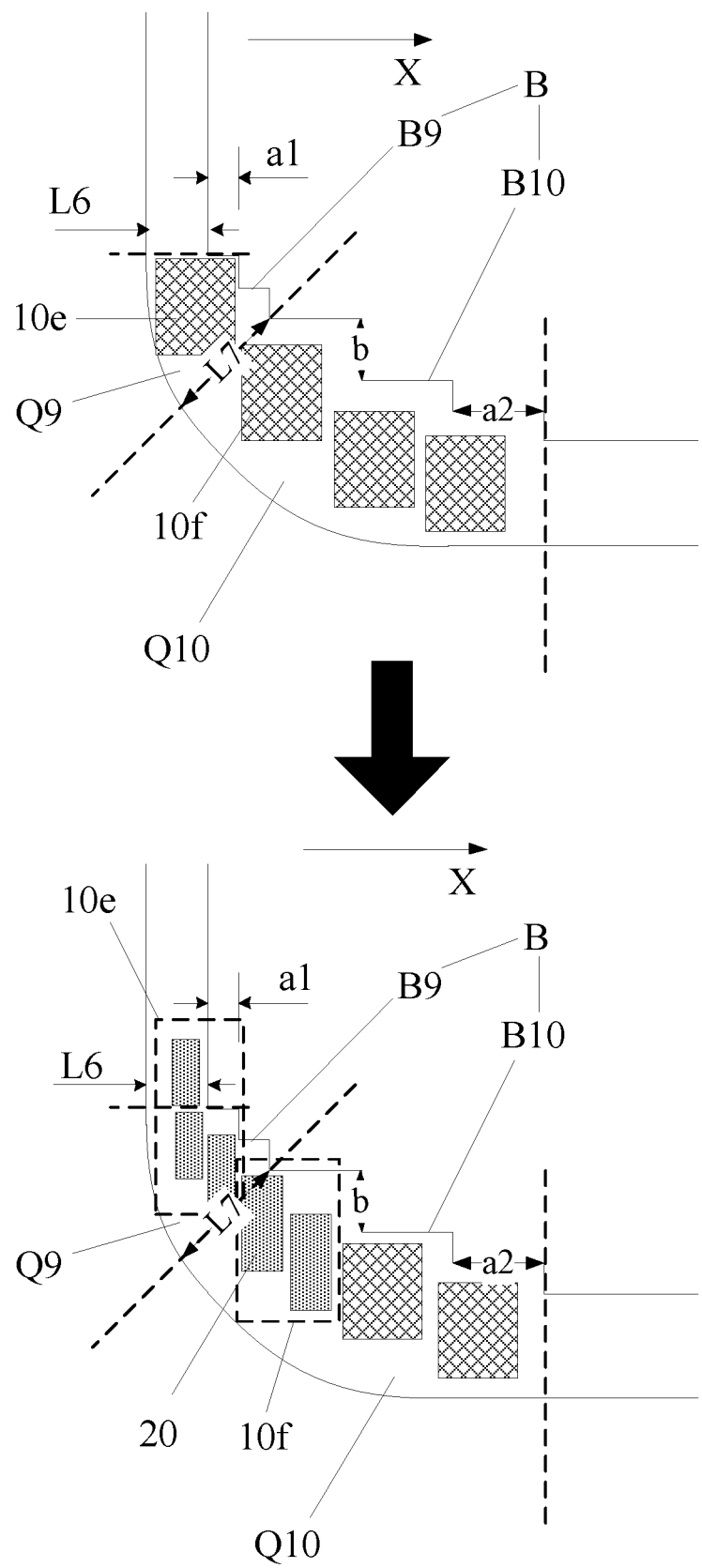
FIG. 7 is a fifth schematic comparison diagram of multi-access selectors according to some embodiments of the disclosure before and after they are segmented.

In one embodiment, the first non-right-angled edge B can be divided into respective sub-edges according to the shape of the step, e.g., the lengths (e.g., a1 and a2 in FIG. 7) and/or the heights (e.g., b in FIG. 7) of respective steps, and as illustrated in FIG. 7, there are two lengths a1 and a2 respectively of the steps, where a2 is larger than a1, so the edge with a step of a length smaller than or equal to a1 can be a sub-edge denoted as B9, and the edge with a step of a length larger than a1 can be a sub-edge denoted as B10, that is, the first non-right-angled edge B can be divided into two sub-edges according to the lengths of the steps. In this way, the utilization ratio of the space in the non-display area m can be improved greatly to thereby improve a screen to panel ratio, and facilitate a design of the display with a narrow bezel.

Of course, the first non-right-angled edge B can be divided according to the shape of the step in another implementation than as illustrated in FIG. 7 as long as it is divided into a plurality of sub-edges according to the shape of the step to thereby improve the flexibility of dividing the first non-right-angled edge B, although embodiments of the disclosure will not be limited thereto.

In one embodiment, in some embodiments of the disclosure, as illustrated in FIG. 3, the display area A can include a first linear edge X1 and a second linear edge X2, and the first non-right-angled edge B intersects with the first linear edge X1 at a first endpoint D1, and intersects with the second linear edge X2 at a second endpoint D2, where the first linear edge X1 and the second linear edge X2 can be arranged nonparallel to each other, and they are arranged perpendicular to each other as illustrated in FIG. 3.

Furthermore the respective sub-areas constitute a combination of sub-areas arranged corresponding to the first non-right-angled edge B, and as illustrated in FIG. 3, an area defined by four endpoints denoted as D1, D2, D3, and D4 is a combination of sub-areas. When the non-display area m includes a circuit area C surrounding the display area A, the combination of sub-areas is located between the circuit area C and the display area A, that is, both the combination of sub-areas and the circuit area C belong to the non-display area m, and the combination of sub-areas is arranged closer to the display area A than the circuit area C, or the combination of sub-areas is arranged closer to the first non-right-angled edge B than the circuit area C.

Hereupon the positional relationship between the respective sub-areas corresponding to the respective sub-edges, and the boundaries of the respective sub-areas can be as illustrated in FIG. 3, and the combination of sub-areas includes a first side and a second side, where the first side is a straight line passing the first endpoint D1 and perpendicular to the first linear edge X1, and the second side is a straight line passing the second endpoint D2 and perpendicular to the second linear edge X2, and any two adjacent sub-areas include a connection side which is a straight line where the normal to a tangent of the intersection between two sub-edges corresponding to the two adjacent sub-areas lies, that is, the two adjacent sub-areas are connected with each other.

As illustrated in FIG. 3, for example, four endpoints of the sub-area denoted as Q1 are D1, D4, D5, and D6 respectively, and four endpoints of the sub-area denoted as Q2 are D5, D6, D2, and D3, that is, Q1 and Q2 include a connection side formed of a straight line connecting D5 and D6.

Of course, the positional relationship between the respective sub-areas can be another positional relationship than as illustrated in FIG. 3, so the respective sub-areas can In one embodiment, be not connected with each other, that is, there is some gap between two adjacent sub-areas, there is some overlapping area between two adjacent sub-areas, etc. The positional relationship between the respective sub-areas can be any positional relationship as long as the multi-access selector or selectors 10 in one or more sub-areas is or are segmented to thereby narrow the area of the non-display area m occupied in the X direction so as to improve a screen to panel ratio, and to design the display with a narrow bezel, although the embodiment of the disclosure will not be limited thereto.

Figure 8:
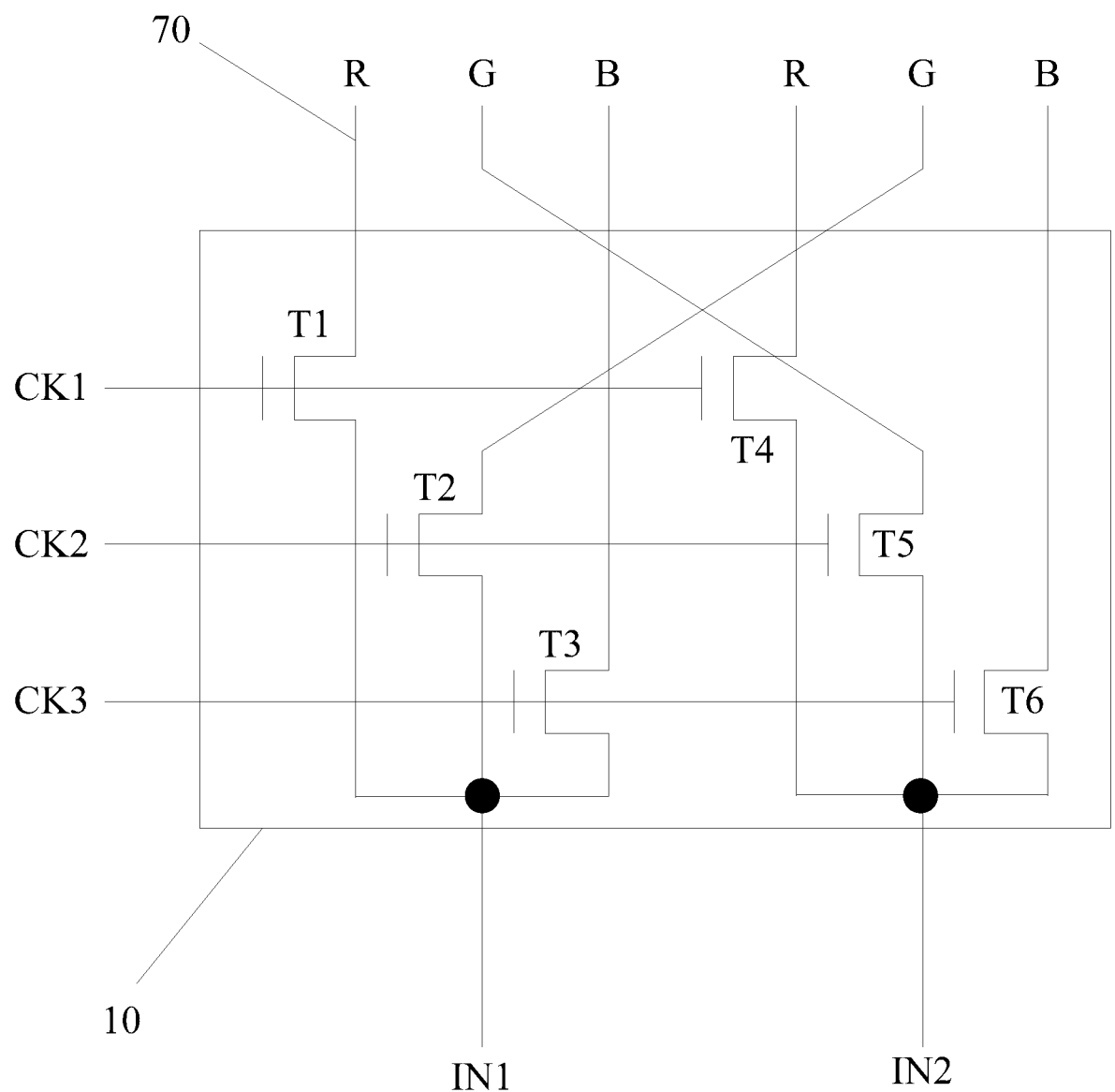
FIG. 8 is a schematic structural diagram in details of a multi-access selector according to some embodiments of the disclosure.

In a particular implementation, in some embodiments of the disclosure, each multi-access selector 10 can include a plurality of transistors T, where the multi-access selector 10 can be structured as illustrated in FIG. 8, and includes: a first transistor T1, a second transistor T2, a third transistor T3, a fourth transistor T4, a fifth transistor T5, and a sixth transistor T6, where the first transistor T1 and the fourth transistor T4 are controlled through a first control signal line CK1, the second transistor T2 and the fifth transistor T5 are controlled through a second control signal line CK2, and the third transistor T3 and the sixth transistor T6 are controlled through a third control signal line CK3; and the multi-access selector 10 includes two signal input terminals IN1 and IN2 respectively, and six signal output terminals electrically connected respectively with six corresponding data lines 70.

In one embodiment, the multi-access selector 10 structured as illustrated in FIG. 8 operates as follows:

when a valid control signal is input on the first control signal line CK1, the first transistor T1 and the fourth transistor T4 are switched on so that the first transistor T1 transmits a source signal input at IN1 to the corresponding data line 70 electrically connected with a column of red sub-pixel elements R, and the fourth transistor T2 transmits a source signal input at IN2 to the corresponding data line 70 electrically connected with another column of red sub-pixel elements R;

when a valid control signal is input on the second control signal line CK2, the second transistor T2 and the fifth transistor T5 are switched on so that the second transistor T2 transmits a source signal input at IN1 to the corresponding data line 70 electrically connected with a column of green sub-pixel elements G, and the fifth transistor T5 transmits a source signal input at IN2 to the corresponding data line 70 electrically connected with another column of green sub-pixel elements Gw;

when a valid control signal is input on the third control signal line CK3, the third transistor T3 and the sixth transistor T6 are switched on so that the third transistor T3 transmits a source signal input at IN1 to the corresponding data line 70 electrically connected with a column of blue sub-pixel elements B, and the sixth transistor T6 transmits a source signal input at IN2 to the corresponding data line 70 electrically connected with another column of blue sub-pixel elements B.

With the operating process above, the multi-access selector 10 can transmit the source signals to the respective data lines 70 in a time division mode to thereby perform a normal display function while reducing the number of routed signal lines for providing the source signals; and since the source signals are typically output from a driver chip, the number of signal lines for the source signals can be reduced to thereby reduce the number of signal terminals in the driver chip for outputting the source signals, so as to simplify the structure of the driver chip, and to facilitate a lower cost of fabricating the array substrate.

In one embodiment, in some embodiments of the disclosure, the respective multi-access selectors 10 can be arranged in the same structure, e.g., the structure as illustrated in FIG. 8, to thereby lower the difficulty of forming the multi-access selectors 10 so as to lower the difficulty and the cost of fabricating the array substrate.

In one embodiment, each multi-access selector 10 in either the structure as illustrated in FIG. 8 or another structure that can include a plurality of transistors, so in the embodiment of the disclosure, the multi-access selector 10 can be segmented into the sub-units 20, and each sub-unit 20 can be at least sized as a transistor, that is, the sub-unit 20 can include at least one transistor.

In this way, the multi-access selector 10 can be segmented into a large number of sub-units 20, and the respective sub-units 20 can be arranged from the left to the right at an interval from the top to the bottom or arranged vertically in the extension direction of the first non-right-angled edge B to thereby narrow in effect the area of the non-display area m occupied in the X direction so as to improve a screen to panel ratio, and to design the display with a narrow bezel.

In one embodiment, in some embodiments of the disclosure, the multi-access selector or selectors 10 can be segmented in the following several instances.

In a first instance, if the smallest distance between a sub-edge, and the sub-edge of a corresponding sub-area away from the sub-edge side is defined as a first distance (represented as L), then when there is the same first distance corresponding to the respective sub-edges, and at least one of the multi-access selectors 10 in the sub-area is segmented into a plurality of sub-units 20, the multi-access selector or selectors 10 in each sub-area will be segmented, and at this time, there is the same area of orthographic projections of the sub-units 20, into which the multi-access selectors 10 in the different sub-areas are segmented, onto the array substrate.

As illustrated in FIG. 3, for example, the first non-right-angled edge B is divided into two sub-edges denoted respectively as B1 and B2, the sub-area corresponding to B1 is Q1, and the sub-area corresponding to B2 is Q2; and both of the multi-access selectors in Q1 are segmented, and one of the multi-access selectors in Q2 is segmented. The first distance corresponding to B1 is L1, and the first distance corresponding to B2 is also L1, that is, there is the same first distance corresponding to the two sub-edges, so there is the same area of orthographic projections of the sub-units 20, into which the multi-access selectors in Q1 and Q2 are segmented, onto the array substrate.

Stated otherwise, there is the same area of the orthographic projections of the sub-units 20, in which the multi-access selectors 10 located in the respective sub-areas are segmented, onto the array substrate, and there are also the same number of sub-units 20 into which those multi-access selectors 10 are segmented.

In this way, the complexity of segmenting the multi-access selectors 10 can be lowered greatly to thereby lower the difficulty of forming the multi-access selectors 10 so as to lower the difficulty and the cost of fabricating the array substrate.

It shall be noted that the area denoted in the dotted circle k as illustrated in FIG. 2 represents the non-display area m between the circuit area C and the display area A, and generally includes a considerable space remaining, but the area denoted in the dotted circle k may not be utilized due to a limited size of each multi-access selector 10. Furthermore the area as denoted in the dotted circle p1 as illustrated in FIG. 2 at the bottom of the array substrate also includes a considerable space remaining to be utilized.

Accordingly in some embodiments of the disclosure, the multi-access selector or selectors 10 can be segmented so that the sum of the lengths of the sub-units 20, into which each multi-access selector 10 is segmented, in the X direction is smaller than the length of the multi-access selector 10 in the X direction, so that the respective sub-units 20 can be arranged from the left to the right at an interval from the top to the bottom or arranged vertically along the first non-right-angled edge B, where the multi-access selector or selectors 10 may not occupy the area denoted in the dotted circle k before it or they is or are segmented, but the sub-units 20 into which the multi-access selector or selectors 10 is or are segmented may occupy a part of the area denoted in the dotted circle k.

In one embodiment, as illustrated in FIG. 3, each of the respective multi-access selectors 10 to be segmented is segmented into two sub-units, and since the respective sub-units 20 are arranged from the left to the right at an interval from the top to the bottom or arranged vertically along the first non-right-angled edge B, and the sum of the lengths of the sub-units 20 in the X direction is less than the length of the multi-access selector 10 in the X direction, the sub-unit denoted as 20a occupies a part of the area denoted in the dotted circle k.

Furthermore since the respective sub-units 20 are arranged from the left to the right at an interval from the top to the bottom or arranged vertically along the first non-right-angled edge B, the sub-units 20 into which some multi-access selector originally lying in Q1 may occupy a part of the area in Q2, and for example, the multi-access selector including the sub-unit denoted as 20b was originally located in Q1, but the sub-unit 20b occupies a part of the area in Q3 after the multi-access selector is segmented.

In this way, the non-display area m other than the combination of sub-areas (e.g., the area denoted in the dotted circle k) can be utilized in effect to thereby narrow the area of the non-display area m occupied in the X direction, and increase the size of the display area A in the X direction so as to improve a screen to panel ratio, and to facilitate a design of the display with a narrow bezel.

It shall be noted that the sub-units 20 into which a multi-access selector 10 is segmented may or may not be still located in the sub-area where the multi-access selector 10 was originally located, as long as the sub-units 20 are arranged from the left to the right at an interval from the top to the bottom or arranged vertically along the first non-right-angled edge B, and the area of the non-display area m occupied by the multi-access selector 10 in the X direction can be narrowed, although the embodiment of the disclosure will not be limited thereto.

In a second instance, the multi-access selectors 10 can also be segmented according to the relationship between the respective first instances except that the respective first instances are different in this instance.

In one embodiment, when the first distances corresponding to the respective sub-edges are different, and at least one of the multi-access selectors 10 in each sub-area is segmented into a plurality of sub-units 20, there are different areas of orthographic projections, of the sub-units 20 into which the multi-access selectors 10 in the different sub-areas are segmented, onto the array substrate as illustrated in FIG. 5 and FIG. 7.

Stated otherwise, when one or more of the multi-access selectors 10 in each sub-area is or are segmented, there are different areas of the orthographic projections, of the sub-units 20 into which the multi-access selectors 10 in the different sub-areas are segmented, onto the array substrate because the respective first distances are different.

As illustrated in FIG. 5, for example, before the multi-access selectors are segmented, the multi-access selector denoted as 10a is located in Q3, the multi-access selector denoted as 10b is located in Q4, and the multi-access selector denoted as 10c is located in Q5. Since any two of the first distances corresponding to the three sub-areas are different, that is, the first distance L3 corresponding to Q3, the first distance L4 corresponding to Q4, and the first distance L5 corresponding to Q5 satisfy that L3<L4<L5, there are distinct areas of orthographic projections, of the sub-units 20 into which the multi-access selectors 10a, 10b, and 10c are segmented, onto the array substrate.

As illustrated in FIG. 7, in another example, before the multi-access selectors are segmented, the multi-access selector denoted as 10e is located in Q9, and the multi-access selector denoted as 10f is located in Q10; and since the first distances corresponding to the two sub-areas are different, that is, the first distance L6 corresponding to Q9, and the first distance L7 corresponding to Q10 satisfy that L6<L7, there are distinct areas of orthographic projections, of the sub-units 20 into which the multi-access selectors 10e and 10f are segmented, onto the array substrate.

In this way, the multi-access selectors 10 can be segmented according to the characteristic of the different sub-areas (i.e., the first distance corresponding to the different sub-areas) to thereby improve the flexibility of segmenting the multi-access selectors, so as to be applicable to displays in various shapes, and thereby greatly improve a screen to panel ratio.

In one embodiment, in some embodiments of the disclosure, the area of the orthographic projections, of the sub-units 20 into which a multi-access selector 10 is segmented, onto the array substrate is positively correlated to the first distance corresponding to the sub-area where the multi-access selector 10 is located, as illustrated in FIG. 5 and FIG. 7.

Stated otherwise, if there is a longer first distance corresponding to the sub-area where a multi-access selector 10 is located, then there will be a larger area of the orthographic projections, of the sub-units 20 into which the multi-access selector 10 is segmented, onto the array substrate, and if there is a shorter first distance corresponding to the sub-area where a multi-access selector 10 is located, then there will be a smaller area of the orthographic projections, of the sub-units 20 into which the multi-access selector 10 is segmented, onto the array substrate. In this way, the flexibility of segmenting the multi-access selector 10 can be improved greatly.

As illustrated in FIG. 5, for example, L3<L4<L5, so there are incrementing areas of the orthographic projections, of the sub-units 20 into which the multi-access selectors 10a, 10b, and 10c are segmented, onto the array substrate.

As illustrated in FIG. 7, in another example, L6<L7, so the area of the orthographic projections, of the sub-units 20 into which the multi-access selector 10e is segmented, onto the array substrate is smaller than the area of the orthographic projections, of the sub-units 20 into which the multi-access selector 10f is segmented, onto the array substrate.

In one embodiment, in some embodiments of the disclosure, there is the same area of the orthographic projections, of the respective sub-units 20 into which the multi-access selectors 10 are segmented, onto the array substrate; and there are the same number of sub-units 20 into which the respective multi-access selectors 10 in the same sub-area are segmented, and there may be different numbers of sub-units 20 into which the respective multi-access selectors 10 in the different sub-areas are segmented. Stated otherwise, if there is a longer first distance corresponding to the sub-area where a multi-access selector 10 is located, then there will be a smaller number of sub-units 20 into which the multi-access selector 10 is segmented, and if there is a shorter first distance corresponding to the sub-area where a multi-access selector 10 is located, then there will be a larger number of sub-units 20 into which the multi-access selector 10 is segmented, as illustrated in FIG. 4 to FIG. 7.

As illustrated in FIG. 7, for example, the multi-access selector denoted as 10e is located in the sub-area denoted as Q9, and the multi-access selector denoted as 10f is located in the sub-area denoted as Q10, where the multi-access selector 10e is segmented into three sub-units 20, and there is the same area of orthographic projections of the three sub-units 20 onto the array substrate; and the multi-access selector 10f is segmented into two sub-units 20, and there is the same area of orthographic projections of the two sub-units 20 onto the array substrate.

In this way, the difficulty of forming the sub-units can be lowered greatly to thereby lower the difficulty of forming the multi-access selectors 10 so as to lower the difficulty and the cost of fabricating the array substrate.

Apparently either the first instance or the second instance above is feasible as long as the multi-access selectors 10 are segmented as appropriate in reality to thereby improve a screen to panel ratio, although the embodiment of the disclosure will not be limited thereto.

Figure 9:
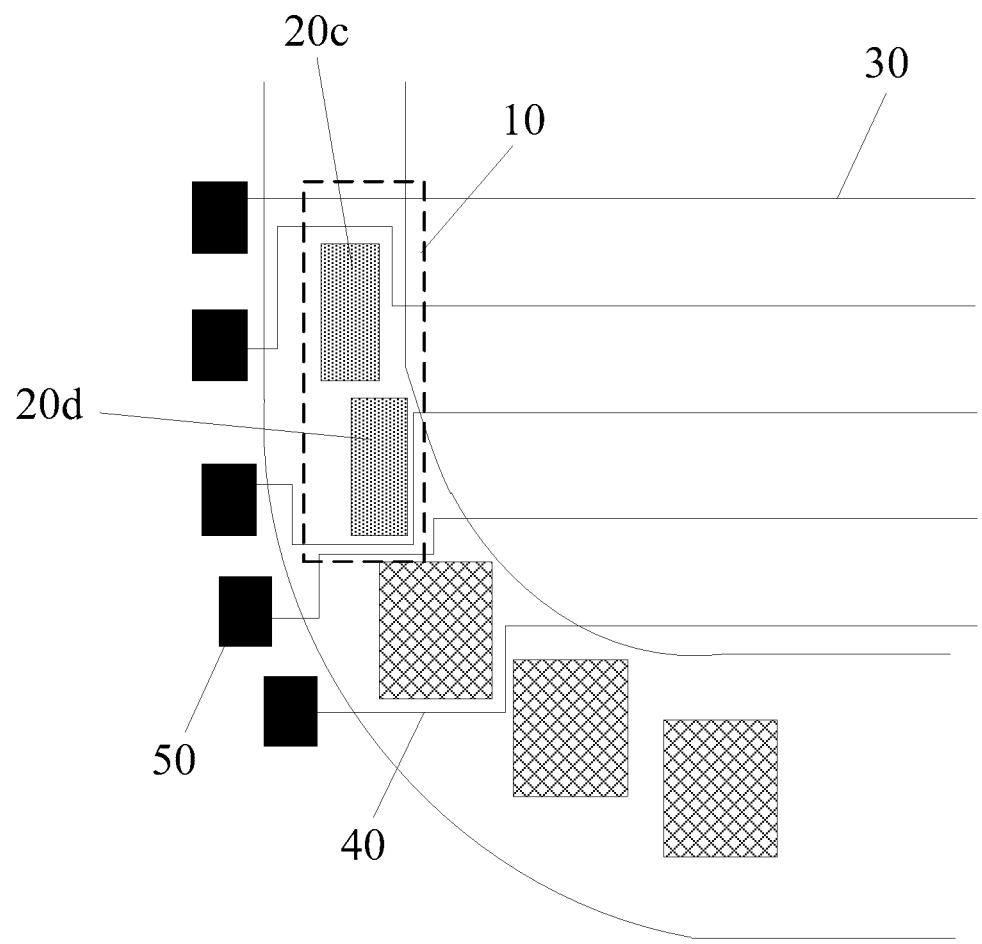
FIG. 9 is a schematic diagram of a positional relationship between a gate-line extension line and a multi-access selector according to some embodiments of the disclosure.

In reality, in order to perform a display function, as illustrated in FIG. 9, generally a plurality of gate lines 30 are arranged in the display area A in parallel, and shift registers 50, and gate-line extension lines 40 electrically connected with the corresponding gate lines 30 are arranged in the non-display area m, where the gate-line extension lines 40 are configured to connect the gate lines 30 with the shift registers 50 so that a scan signal output by the shift registers 50 can be transmitted to the corresponding gate line 30 on the gate-line extension lines 40 to thereby perform the display function.

Accordingly in order to enable a display function, in some embodiments of the disclosure, orthographic projections of the gate-line extension lines 40 onto the array substrate do not overlap with orthographic projections of the multi-access selectors 10 onto the array substrate as illustrated in FIG. 9, that is, the gate-line extension lines 40 are arranged to obviate the multi-access selectors 10 instead of passing between the different sub-units 20 of the same multi-access selector 10; and as illustrated in FIG. 9, the gate-line extension line 40 passes the gap between two multi-access selectors, and since the same multi-access selector is segmented into the two sub-units denoted as 20c and 20d, the gate-line extension line 40 will not pass between the sub-units 20c and 20d to thereby avoid a scan signal on the gate-line extension line 40 from interfering with the multi-access selector 10, so as to enable the multi-access selector 10 to operate normally, and to enable the scan signal to be transmitted normally, thus performing the display function normally.

In a particular implementation, in order to perform a display function, as illustrated in FIG. 2, only a part of the data lines 70 are illustrated, and generally a driver chip 60 is arranged in the non-display area m, where the driver chip 60 can be electrically connected with the multi-access selectors 10, and is configured to output the source signals to the multi-access selectors 10 so that the source signals are output to the respective data lines 70 connected with the corresponding multi-access selectors 10 in a time division mode. Furthermore when the display area A includes at least one second non-right-angled edge B20, the first non-right-angled edge B can be arranged proximate to the driver chip 60, and the second non-right-angled edge B20 can be arranged away from the driver chip 60.

In one embodiment, in the array substrate as illustrated in FIG. 2, if the area p2 represents the top, and the area p1 represents the bottom, then the first non-right-angled edge B may be arranged proximate to the bottom, and the second non-right-angled edge B20 may be arranged proximate to the top; and since generally a camera and other components are arranged at the top, the driver chip 60 is generally arranged at the bottom. The multi-access selectors 10 are configured to select and process the source signals output by the driver chip 60, and to transmit them to the respective data lines 70 connected with the corresponding multi-access selectors 10, so the multi-access selectors 10 are generally arranged proximate to the driver chip 60, that is, they are generally arranged at the bottom, to thereby optimize the structure of the array substrate.

Figure 10:
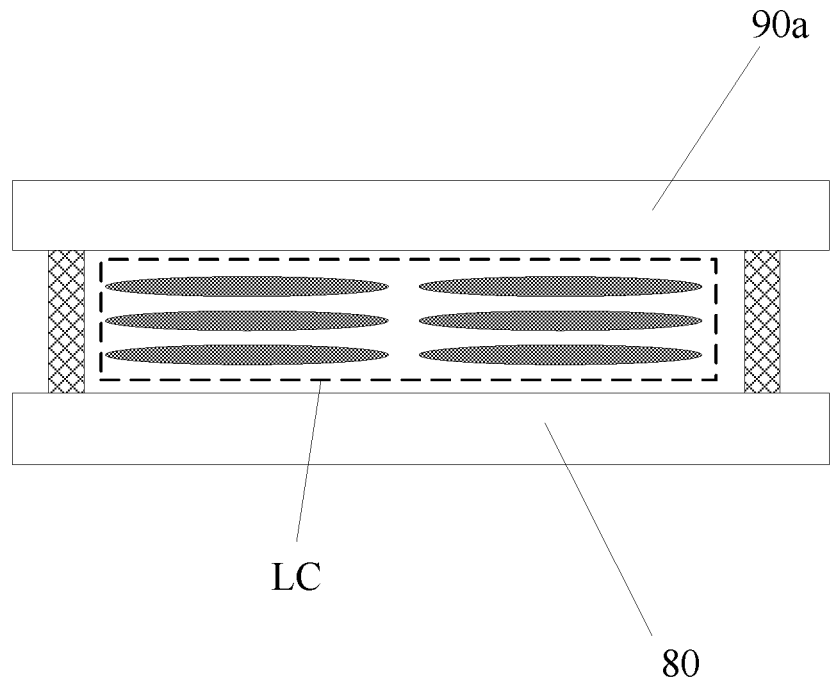
FIG. 10 is a schematic structural diagram of a display panel according to some embodiments of the disclosure.
Figure 12:
FIG. 12 is a schematic structural diagram of a display device according to some embodiments of the disclosure.

Some embodiments of the disclosure provide a display device as illustrated in FIG. 12, which includes a display panel 100, where the display panel 10 can be a liquid crystal display panel, and at this time, the display panel 10 includes the array substrate 80 above according to the embodiment of the disclosure, and also includes an opposite substrate 90a arranged opposite to the array substrate 80, and liquid crystals (LC) located between the array substrate 80 and the opposite substrate 90a, as illustrated in FIG. 10.

Figure 11:
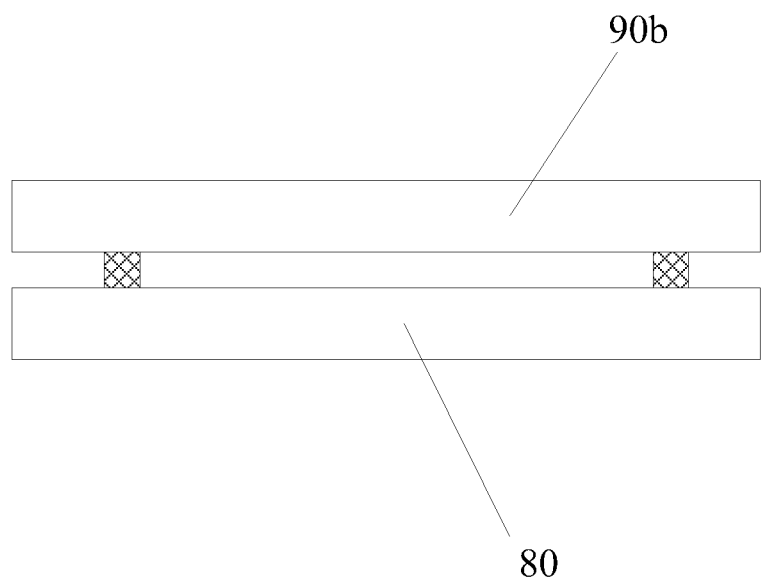
FIG. 11 is a schematic structural diagram of another display panel according to some embodiments of the disclosure.

In one embodiment, the display panel 10 can be a light-emitting diode display panel, and at this time, the display panel 10 includes the array substrate 80 above according to the embodiment of the disclosure, and also includes an opposite substrate 90b arranged opposite to the array substrate 80, as illustrated in FIG. 11, where the opposite substrate 90b can be an encapsulation substrate.

In a particular implementation, the display device can be a mobile phone (as illustrated in FIG. 12), a tablet computer, a TV set, a monitor, a notebook computer, a digital photo frame, a navigator, or any other product or component with a display function. Reference can be made to the embodiment of the array substrate above for an implementation of the display device, so a repeated description thereof will be omitted here.

What is claimed is:

1. An array substrate, comprising:
a display area, and a non-display area surrounding the display area, wherein:
the display area comprises at least one first non-right-angled edge; and
a plurality of multi-access selectors are arranged in the non-display area proximate to the first non-right-angled edge, wherein at least one of the multi-access selectors is segmented into a plurality of electrically connected sub-units, and the sub-units are arranged in an extension direction of the first non-right-angled edge.

2. The array substrate according to claim 1, wherein the first non-right-angled edge comprises a first endpoint and a second endpoint; and
the first non-right-angled edge is divided into at least two sub-edges, the non-display area comprises sub-areas corresponding to the sub-edges, the multi-access selectors are arranged in the sub-areas, and at least one of the multi-access selectors in the sub-area corresponding to the sub-edge comprising the first endpoint is segmented into a plurality of sub-units.

3. The array substrate according to claim 2, wherein the first non-right-angled edge is shape like an arc, and the first non-right-angled edge is divided into the sub-edges according to the curvature thereof; or
the first non-right-angled edge is shaped like a step, and the first non-right-angled edge is divided equally into the sub-edges, or the first non-right-angled edge is divided into the sub-edges according to a shape of the step.

4. The array substrate according to claim 2, wherein the display area comprises a first linear edge and a second linear edge, the first non-right-angled edge intersects with the first linear edge at the first endpoint, and intersects with the second linear edge at the second endpoint, and the first linear edge and the second linear edge are arranged nonparallel to each other;
- the sub-areas constitute a combination of sub-areas arranged corresponding to the first non-right-angled edge;
- the non-display area comprises a circuit area surrounding the display area, the combination of sub-areas is between the circuit area and the display area;
- the combination of sub-areas comprises a first side and a second side, wherein the first side is a straight line passing the first endpoint and perpendicular to the first linear edge, and the second side is a straight line passing the second endpoint and perpendicular to the second linear edge; and
- any adjacent two of the sub-areas comprises a connection side, the connection side is a straight line where a normal to a tangent of an intersection between the two sub-edges corresponding to the two adjacent sub-areas lies.

5. The array substrate according to claim 2, wherein a smallest distance between the sub-edges and other sub-edges of corresponding sub-areas away from the sub-edges is a first distance, and the first distance corresponding to each of the sub-edges is same;
- at least one of the multi-access selectors in the sub-area is segmented into a plurality of sub-units; and
- areas of orthographic projections of the sub-units, into which the multi-access selectors in different sub-areas are segmented, onto the array substrate are same.

6. The array substrate according to claim 5, wherein areas of the orthographic projections of the sub-units, into which the multi-access selectors are segmented, onto the array substrate are same.

7. The array substrate according to claim 6, wherein quantities of sub-units into which the multi-access selectors in a same sub-area are segmented are same.

8. The array substrate according to claim 2, wherein a smallest distance between the sub-edges and other sub-edges of corresponding sub-areas away from the sub-edges is a first distance, and the first distance corresponding to each of the sub-edges is different;
- at least one of the multi-access selectors in the sub-area is segmented into a plurality of sub-units; and
- areas of orthographic projections of the sub-units, into which the multi-access selectors in the different sub-areas are segmented, onto the array substrate are different.

9. The array substrate according to claim 8, wherein areas of the orthographic projections, of the sub-units into which the multi-access selector is segmented, onto the array substrate are positively correlated to the first distance corresponding to the sub-area where the multi-access selector is.

10. The array substrate according to claim 1, wherein gate lines are arranged in the display area, and gate-line extension lines electrically connected with the gate lines are arranged in the non-display area; and
- orthographic projections of the gate-line extension lines onto the array substrate do not overlap with orthographic projections of the multi-access selectors onto the array substrate.

11. The array substrate according to claim 1, wherein each multi-access selector comprises a plurality of transistors; and
- each of the sub-units comprises at least one of the transistors.

12. The array substrate according to claim 1, wherein a driver chip is arranged in the non-display area, and the display area comprises at least one second non-right-angled edge;
- the first non-right-angled edge is arranged proximate to the driver chip; and
- the second non-right-angled edge is arranged away from the driver chip.

13. The array substrate according to claim 1, wherein structures of the multi-access selectors are same.

14. A display device, comprising:
a display panel comprising:
an array substrate, comprising:
a display area, and a non-display area surrounding the display area, wherein:
- the display area comprises at least one first non-right-angled edge; and
- a plurality of multi-access selectors are arranged in the non-display area proximate to the first non-right-angled edge, wherein at least one of the multi-access selectors is segmented into a plurality of electrically connected sub-units, and the sub-units are arranged in an extension direction of the first non-right-angled edge.

* * * * *